(12) United States Patent
Ishiwata et al.

(10) Patent No.: US 10,348,251 B2
(45) Date of Patent: Jul. 9, 2019

(54) POWER SUPPLY CIRCUIT

(71) Applicant: Murata Manufacturing Co., Ltd., Kyoto-fu (JP)

(72) Inventors: Yu Ishiwata, Nagaokakyo (JP); Yoshihiro Imanishi, Nagaokakyo (JP); Shingo Uda, Nagaokakyo (JP); Tatsumasa Kawahara, Nagaokakyo (JP); Kota Takayama, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/861,079

(22) Filed: Jan. 3, 2018

(65) Prior Publication Data

US 2018/0145640 A1    May 24, 2018

Related U.S. Application Data

(63) Continuation of application No. PCT/JP2016/066897, filed on Jun. 7, 2016.

(30) Foreign Application Priority Data

Jul. 7, 2015   (JP) .................. 2015-136006

(51) Int. Cl.
  *H03G 3/20* (2006.01)
  *H03F 1/26* (2006.01)
  (Continued)

(52) U.S. Cl.
  CPC .............. *H03F 1/26* (2013.01); *H03F 3/189* (2013.01); *H03F 3/20* (2013.01); *H03F 3/24* (2013.01);
  (Continued)

(58) Field of Classification Search
  CPC ..... H03F 1/0216; H03F 1/0222; H03F 1/0227
  (Continued)

(56) References Cited

U.S. PATENT DOCUMENTS 8,610,503 B2 * 12/2013 Kaczman ................ H03F 1/083
                                                                       330/124 R
2006/0178119 A1    8/2006 Jarvinen
  (Continued)

FOREIGN PATENT DOCUMENTS

| JP | 2008-042917 A | 2/2008 |
| JP | 2009-253785 A | 10/2009 |
| JP | 2014-502808 A | 2/2014 |

OTHER PUBLICATIONS

International Search Report issued in PCT/JP2016/066897; dated Aug. 30, 2016.
  (Continued)

*Primary Examiner* — Steven J Mottola
(74) *Attorney, Agent, or Firm* — Studebaker & Brackett PC

(57) ABSTRACT

A power supply circuit includes a plurality of power amplifiers for amplifying radio frequency signals, an envelope tracker for supplying a variable voltage based on an envelope signal to the power amplifiers, a common line connected to an output side of the envelope tracker, and a plurality of branch lines branching from a tip of the common line and connected to the power amplifiers, respectively. On the branch lines, sub-inductors are provided, respectively. On the common line, a main inductor and a capacitor are provided.

12 Claims, 5 Drawing Sheets

(51) Int. Cl.
*H04B 1/04* (2006.01)
*H03F 3/189* (2006.01)
*H03F 3/20* (2006.01)
*H03F 3/24* (2006.01)
*H03F 3/68* (2006.01)

(52) U.S. Cl.
CPC ............... *H03F 3/68* (2013.01); *H04B 1/04* (2013.01); *H04B 1/0475* (2013.01); *H03F 2200/102* (2013.01); *H03F 2200/451* (2013.01); *H04B 2001/0433* (2013.01)

(58) Field of Classification Search
USPC ........................................ 330/127, 136, 297
See application file for complete search history.

(56) References Cited

U.S. PATENT DOCUMENTS

2012/0146731 A1  6/2012  Khesbak
2014/0009226 A1  1/2014  Severson

OTHER PUBLICATIONS

Written Opinion issued in PCT/JP2016/066896; dated Aug. 30, 2016.
An Office Action; "Notification of Reasons for Refusal," Mailed by the Japanese Patent Office dated Oct. 9, 2018, which corresponds to Japanese Patent Application No. 2017-527138 and is related to U.S. Appl. No. 15/861,079; with English language translation.

\* cited by examiner

POWER SUPPLY CIRCUIT

CROSS-REFERENCE TO RELATED APPLICATIONS

This application claims benefit of priority to International Patent Application No. PCT/JP2016/066897, filed Jun. 7, 2016, and to Japanese Patent Application No. 2015-136006, filed Jul. 7, 2015, the entire contents of each are incorporated herein by reference.

TECHNICAL FIELD

The present disclosure relates to a power supply circuit which reduces a noise signal of a radio frequency signal using an inductor.

BACKGROUND ART

Generally speaking, in a power supply circuit including an envelope tracker and a plurality of power amplifiers, a configuration has been known in which an inductor for choking is connected to each of the power amplifiers as described, for example, in Japanese Unexamined Patent Application Publication (Translation of PCT Application) No. 2014-502808. That is, Japanese Unexamined Patent Application Publication No. 2014-502808 discloses a power supply circuit which causes a noise signal leaked from power amplifiers not to flow to the exterior and prevents the noise signal from flowing in the power amplifiers by an inductor.

SUMMARY

Incidentally, in a case where a noise signal is conducted from an envelope tracker toward the power amplifiers, the power supply circuit disclosed in Patent Document 1 prevents the noise signal from flowing in the power amplifiers by each inductor reflecting the noise signal. In this case, because the noise signal returns to the envelope tracker again by the inductor reflecting the noise signal, a resonance may occur in a connection line between the envelope tracker and each of the power amplifiers. As a result, the noise signal is radiated from the connection line, there is thus a problem that communication characteristics deteriorate.

The present disclosure has been made in view of the above-described problems and an object of the present disclosure is to provide a power supply circuit suppressing a noise signal conducted between an envelope tracker and each power amplifier.

In order to solve the problem described above, a power supply circuit according to the present disclosure includes a plurality of power amplifiers for amplifying a radio frequency signal, an envelope tracker for supplying a variable voltage based on an envelope signal to the plurality of power amplifiers, a common line connected to an output side of the envelope tracker, and a plurality of branch lines branching from a tip of the common line and respectively connected to the plurality of power amplifiers. The power supply circuit according to the present disclosure further includes a plurality of sub-inductors respectively provided on the plurality of branch lines, a main inductor provided on the common line, and a capacitor provided on the common line.

According to the present disclosure, the power supply circuit includes the main inductor provided on the common line and the sub-inductors provided on the branch lines. In this case, a noise signal conducted in the common line can be reduced by the main inductor, a noise signal conducted in the branch line can be reduced by the sub-inductor. This makes it possible to reduce the noise signal conducted from the envelope tracker toward each of the power amplifiers by the sub-inductor and the main inductor. As a result, resonance and radiation of the noise signal between the envelope tracker and each of the power amplifiers can be suppressed, and thus it is possible to suppress degradation of reception sensitivity and to improve communication characteristics.

In the power supply circuit according to the present disclosure, a cutoff frequency of the main inductor is preferably higher than a frequency of the envelope signal. In this case, the power supply circuit can attenuate the noise signal while suppressing attenuation of the envelope signal.

In the power supply circuit according to the present disclosure, a self-resonant frequency of the main inductor is preferably higher than the lowest self-resonant frequency among self-resonant frequencies of the respective sub-inductors.

The plurality of power amplifiers amplify the radio frequency signals with different frequencies from one another, for example. At this time, in order to suppress a noise signal with respect to the radio frequency signals, the self-resonant frequencies of the respective sub-inductors are preferably set within bands of the radio frequency signals amplified by each of the power amplifiers, for example. In contrast, because the self-resonant frequency of the main inductor is made higher than the lowest self-resonant frequency among the self-resonant frequencies of the respective sub-inductors, across the plurality of radio frequency signal bands, impedance of the main inductor can be increased. This makes it possible to reduce the noise signals of the plurality of radio frequency signal bands.

In the power supply circuit according to the present disclosure, an electric length between the envelope tracker and the main inductor is preferably shorter than a half-wave length of a signal with the highest frequency among the radio frequency signals. This makes it possible, even when multiple reflection of the noise signal arises between the envelope tracker and the main inductor and the noise signal is radiated, to make a frequency of the noise signal to be radiated higher than the highest frequency among the radio frequency signals. Therefore, the frequency of the noise signal can be made to be outside the bands of the plurality of radio frequency signals, and influence of the noise signal with respect to the radio frequency signals can be reduced.

In the power supply circuit according to the present disclosure, an electric length between the envelope tracker and the power amplifier is preferably shorter than the half-wave length of the signal with the highest frequency among the radio frequency signals. This makes it possible, even when multiple reflection of the noise signal arises between the envelope tracker and the power amplifier and the noise signal is radiated, to make a frequency of the noise signal to be radiated higher than the highest frequency among the radio frequency signals. Therefore, the frequency of the noise signal can be made to be outside the bands of the plurality of radio frequency signals, and influence of the noise signal with respect to the radio frequency signals can be reduced.

DESCRIPTION OF EMBODIMENTS

Hereinafter, a power supply circuit according to an embodiment of the present disclosure will be described in detail using a case of being applied to a multiband mobile terminal as an example with reference to the accompanying drawings.

Figure 1:
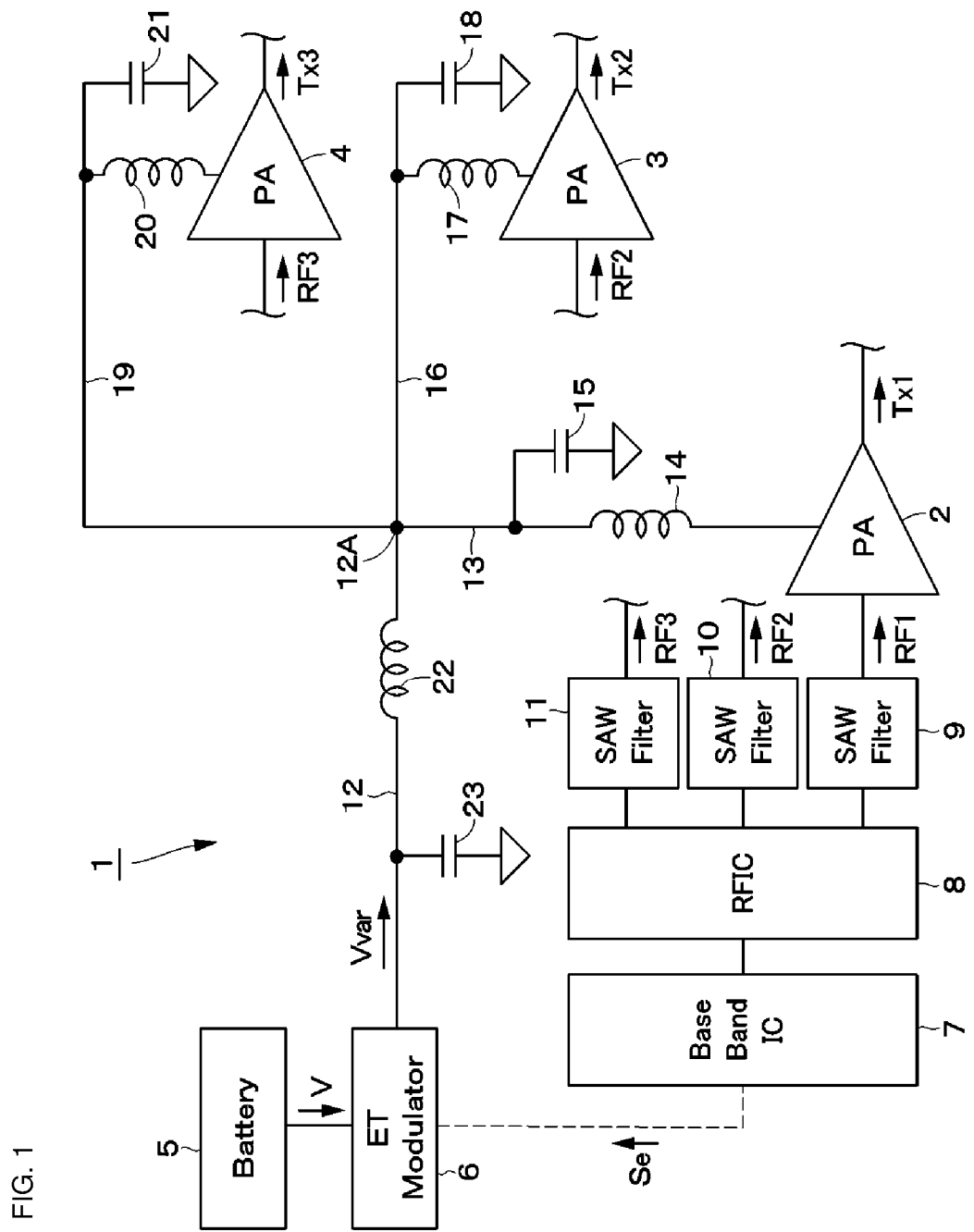
FIG. 1 is a circuit diagram illustrating the overall configuration of a power supply circuit according to an embodiment of the present disclosure.

FIG. 1 illustrates a power supply circuit 1 according to the present embodiment. The power supply circuit 1 includes power amplifiers 2, 3, and 4, an envelope tracker 6 (ET modulator 6), a common line 12, branch lines 13, 16, and 19, sub-inductors 14, 17, and 20, a main inductor 22, a capacitor 23, and the like. This power supply circuit 1 is used, for example, in a mobile device such as a mobile terminal or the like, for transmitting various signals such as audio, data, or the like, to a base station (not illustrated) using three types of radio frequency signals RF1, RF2, and RF3, for example.

In the power amplifier 2, a power supply input terminal is connected to a power supply voltage circuit 5 (battery 5) with the branch line 13 interposed therebetween, a signal input terminal is connected to a baseband portion 7 (baseband integrated circuit (IC) 7) with an RF portion 8 (RF integrated circuit (IC) 8) and a SAW filter 9 interposed therebetween. This power amplifier 2 is, for example, configured by using an operational amplifier. With this configuration, the power amplifier 2 amplifies, on the basis of a variable voltage Vvar supplied from the envelope tracker 6, power of the radio frequency signal RF1 outputted from the RF portion 8 to a level necessary for transmission to the base station, and outputs a transmission signal Tx1 from an output terminal. At this time, the radio frequency signal RF1 is a signal of a first frequency band such as a 700 MHz band, for example.

In the power amplifier 3, a power supply input terminal is connected to the power supply voltage circuit 5 with the branch line 16 interposed therebetween, a signal input terminal is connected to the baseband portion 7 with the RF portion 8 and a SAW filter 10 interposed therebetween. This power amplifier 3 is configured by using the operational amplifier in the same manner as the power amplifier 2, for example. In this case, the power amplifier 3 amplifies the radio frequency signal RF2 different from that in the power amplifier 2, and outputs a transmission signal Tx2 from an output terminal. At this time, the radio frequency signal RF2 is a signal of a second frequency band such as a 1.5 GHz band, for example, as a different frequency from the first frequency band.

In the power amplifier 4, a power supply input terminal is connected to the power supply voltage circuit 5 with the branch line 19 interposed therebetween, a signal input terminal is connected to the baseband portion 7 with the RF portion 8 and a SAW filter 11 interposed therebetween. This power amplifier 4 is configured by using the operational amplifier in the same manner as the power amplifier 2, for example. In this case, the power amplifier 4 amplifies the radio frequency signal RF3 different from those in the power amplifiers 2 and 3, and outputs a transmission signal Tx3 from an output terminal. At this time, the radio frequency signal RF3 is a signal of a third frequency band such as a 2 GHz band, for example, as a different frequency from the first and second frequency bands.

Additionally, an electric length combining the common line 12 and the branch line 13 connecting the power amplifier 2 and the envelope tracker 6 is shorter than a half-wave length of a signal with the highest frequency among the three types of radio frequency signals RF1, RF2, and RF3. In the same manner, an electric length combining the common line 12 and the branch line 16 connecting the power amplifier 3 and the envelope tracker 6 is shorter than the half-wave length of the signal with the highest frequency among the three types of radio frequency signals RF1, RF2, and RF3. An electric length combining the common line 12 and the branch line 19 connecting the power amplifier 4 and the envelope tracker 6 is shorter than the half-wave length of the signal with the highest frequency among the three types of radio frequency signals RF1, RF2, and RF3.

The power supply voltage circuit 5 is configured by a battery, for example, an output side thereof is connected to the envelope tracker 6. This power supply voltage circuit 5 supplies a constant power supply voltage V to the envelope tracker 6.

The envelope tracker 6 is provided between the power supply voltage circuit 5 and each of the power amplifiers 2, 3, and 4. This envelope tracker 6 is connected to the baseband portion 7, and detects an envelope component (envelope signal Se) of a baseband signal (IQ signal) outputted from the baseband portion 7. With this configuration, the envelope tracker 6 controls the power supply voltage V, supplies the variable voltage Vvar based on the envelope component to each of the power amplifiers 2, 3, and 4. In other words, the envelope tracker 6 adjusts the variable voltage Vvar such that variable supply power supplied to each of the power amplifiers 2, 3, and 4 changes in accordance with the envelope component (amplitude of radio frequency signals RF1, RF2, and RF3) of the baseband signal. At this time, the variable voltage Vvar increases when the envelope component increases, and the variable voltage Vvar decreases when the envelope component decreases.

The baseband portion 7 modulates an input signal (not illustrated) such as audio, data or the like to the baseband signal, and outputs the baseband signal to the RF portion 8. In this case, the baseband portion 7 outputs the envelope signal Se toward the envelope tracker 6 in order for the envelope tracker 6 to perform envelope tracking. Here, a frequency of the envelope signal Se, which is set by the baseband portion 7, for example, is approximately 20 MHz.

An input side of the RF portion 8 is connected to the baseband portion 7, output sides of the RF portion 8 are respectively connected to the SAW filters 9, 10, and 11. This RF portion 8 up-converts the baseband signal outputted from the baseband portion 7, generates each of the radio frequency signals RF1, RF2, and RF3 for performing radio transmission.

An input side of the SAW filter 9 is connected to the RF portion 8, an output side of the SAW filter 9 is connected to the power amplifier 2. This SAW filter 9 configures a band pass filter which allows a signal of the frequency band of the radio frequency signal RF1 to pass. Specifically, the SAW filter 9 is formed using a piezoelectric substrate or the like, removes a signal excluding a signal of the band of the radio frequency signal RF1 by using surface acoustic waves. The SAW filter 9 outputs the radio frequency signal RF1 after being filtered toward the power amplifier 2.

An input side of the SAW filter 10 is connected to the RF portion 8, an output side of the SAW filter 10 is connected to the power amplifier 3. This SAW filter 10 configures a band pass filter in the same manner as the SAW filter 9, allows a signal of the frequency band of the radio frequency signal RF2 to pass. The SAW filter 10 outputs the radio frequency signal RF2 after being filtered toward the power amplifier 3.

An input side of the SAW filter 11 is connected to the RF portion 8, an output side of the SAW filter 11 is connected to the power amplifier 4. This SAW filter 11 configures a band pass filter in the same manner as the SAW filters 9 and 10, allows a signal of the frequency band of the radio frequency signal RF3 to pass. The SAW filter 11 outputs the radio frequency signal RF3 after being filtered toward the power amplifier 4.

The common line 12 connects the envelope tracker 6 and the plurality of branch lines 13, 16, and 19. In other words, one end of the common line 12 is connected to an output side of the envelope tracker 6. Another end of the common line 12 is connected to one ends of the plurality of branch lines 13, 16, and 19 by being a branch point 12A. This common line 12 supplies the variable voltage Vvar controlled by the envelope tracker 6 toward each of the power amplifiers 2, 3, and 4. On the common line 12, the main inductor 22 and the capacitor 23 are provided.

The branch line 13 connects the branch point 12A of the common line 12 and the power amplifier 2. In other words, one end of the branch line 13 branches from the branch point 12A of the common line 12, another end of the branch line 13 is connected to the power supply input terminal of the power amplifier 2. This branch line 13 supplies the variable voltage Vvar outputted from the common line 12 toward the power amplifier 2. On the branch line 13, the sub-inductor 14 and a sub-capacitor 15 are provided.

The sub-inductor 14 is provided on the branch line 13, is formed from a core coil, for example. These sub-inductor 14 and sub-capacitor 15 attenuate a noise signal flowing in the branch line 13. In this case, a self-resonant frequency of the sub-inductor 14 is, in order to suppress entrance of the noise signal into the power amplifier 2, set to a value within the band of the radio frequency signal RF1, for example. Accordingly, the sub-inductor 14 attenuates the noise signal of a peripheral band of the radio frequency signal RF1.

The sub-capacitor 15 is located between the branch point 12A of the common line 12 and the sub-inductor 14, is provided on the branch line 13. In other words, the sub-capacitor 15 is provided nearer on the envelope tracker 6 side than the sub-inductor 14. One end side of the sub-capacitor 15 is connected to the branch line 13, another end side of the sub-capacitor 15 is grounded. With this configuration, the sub-capacitor 15 attenuates the noise signal flowing in the branch line 13 by cooperating with the sub-inductor 14.

The branch line 16 connects the branch point 12A of the common line 12 and the power amplifier 3. In other words, one end of the branch line 16 branches from the branch point 12A of the common line 12, another end of the branch line 16 is connected to the power supply input terminal of the power amplifier 3. This branch line 16 supplies the variable voltage Vvar outputted from the common line 12 toward the power amplifier 3. On the branch line 16, the sub-inductor 17 and a sub-capacitor 18 are provided.

The sub-inductor 17 is provided on the branch line 16, is formed from a core coil, for example. These sub-inductor 17 and sub-capacitor 18 attenuate a noise signal flowing in the branch line 16. In this case, a self-resonant frequency of the sub-inductor 17 is, in order to suppress entrance of the noise signal into the power amplifier 3, set to a value within the band of the radio frequency signal RF2, for example. Accordingly, the sub-inductor 17 attenuates the noise signal of a peripheral band of the radio frequency signal RF2.

The sub-capacitor 18 is located between the branch point 12A of the common line 12 and the sub-inductor 17, is provided on the branch line 16. In other words, the sub-capacitor 18 is provided nearer on the envelope tracker 6 side than the sub-inductor 17. One end side of the sub-capacitor 18 is connected to the branch line 16, another end side of the sub-capacitor 18 is grounded. With this configuration, the sub-capacitor 18 attenuates the noise signal flowing in the branch line 16 by cooperating with the sub-inductor 17.

The branch line 19 connects the branch point 12A of the common line 12 and the power amplifier 4. In other words, one end of the branch line 19 branches from the branch point 12A of the common line 12, another end of the branch line 19 is connected to the power supply input terminal of the power amplifier 4. This branch line 19 supplies the variable voltage Vvar outputted from the common line 12 toward the power amplifier 4. On the branch line 19, the sub-inductor 20 and a sub-capacitor 21 are provided.

The sub-inductor 20 is provided on the branch line 19, is formed from a core coil, for example. These sub-inductor 20 and sub-capacitor 21 attenuate a noise signal flowing in the branch line 19. In this case, a self-resonant frequency of the sub-inductor 20 is, in order to suppress entrance of the noise signal into the power amplifier 4, set to a value within the band of the radio frequency signal RF3, for example. Accordingly, the sub-inductor 20 attenuates the noise signal of a peripheral band of the radio frequency signal RF3.

The sub-capacitor 21 is located between the branch point 12A of the common line 12 and the sub-inductor 20, is provided on the branch line 19. In other words, the sub-capacitor 21 is provided nearer on the envelope tracker 6 side than the sub-inductor 20. One end side of the sub-capacitor 21 is connected to the branch line 19, another end side of the sub-capacitor 21 is grounded. With this configuration, the sub-capacitor 21 attenuates the noise signal flowing in the branch line 19 by cooperating with the sub-inductor 20.

The main inductor 22 is provided on the common line 12, is formed from a core coil, for example. This main inductor 22 attenuates a noise signal flowing in the common line 12. It is necessary for the main inductor 22 to allow the variable voltage Vvar which changes in accordance with the envelope signal Se to pass. Accordingly, a self-resonant frequency of the main inductor 22 is higher than the frequency of the envelope signal Se.

Additionally, the main inductor 22 preferably attenuates the noise signal of the frequency bands of the radio frequency signals RF1, RF2, and RF3. At this time, each of the self-resonant frequencies of each of the sub-inductors 14, 17, and 20 is set to a value corresponding to each of the frequency bands of the radio frequency signals RF1, RF2, and RF3. Accordingly, the self-resonant frequency of the main inductor 22 is set to a value higher than the lowest self-resonant frequency among the respective self-resonant frequencies of the respective sub-inductors 14, 17, and 20.

With this configuration, the main inductor 22 attenuates the noise signal, whose frequency is higher than that of the envelope signal Se, of the frequency bands of the radio frequency signals RF1, RF2, and RF3, for example, among the noise signals flowing in the common line 12 from the envelope tracker 6 side.

Figure 2:
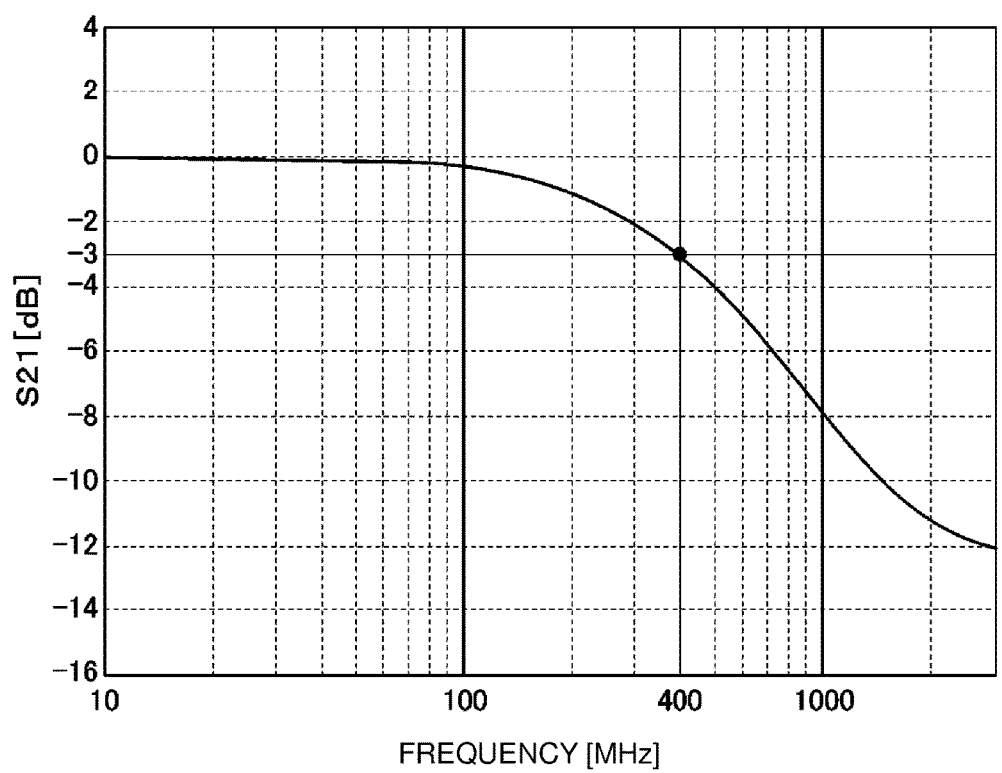
FIG. 2 is a characteristic line diagram illustrating frequency characteristics of insertion loss of a main inductor in FIG. 1.

FIG. 2 illustrates an example of frequency characteristics of insertion loss of the main inductor 22 (S (Scattering) parameter S21). Note that, FIG. 2 illustrates characteristics when LQW15CN33NJ00 manufactured by Murata Manufacturing Co., Ltd. is used as the main inductor 22. As illustrated in FIG. 2, in the main inductor 22, the insertion loss increases in the vicinity of approximately 100 MHz as a boundary. Additionally, a cutoff frequency at which the insertion loss of the main inductor 22 becomes −3 dB is a value in the vicinity of 400 MHz which is higher than the frequency of the envelope signal Se. With this, the main inductor 22 can attenuate the noise signal of a higher frequency side than the envelope signal Se.

Additionally, an electric length between the main inductor 22 and the envelope tracker 6 is shorter than the half-wave length of the signal with the highest frequency (the radio frequency signal RF3) among the radio frequency signals RF1, RF2, and RF3 used for the power amplifiers 2, 3, and 4. With this configuration, even when multiple reflection of the noise signal occurs between the main inductor 22 and the envelope tracker 6, the noise signal is suppressed from being radiated to the exterior in the band of each of the radio frequency signals RF1, RF2, and RF3.

The capacitor 23 is located between the envelope tracker 6 and the main inductor 22, is provided on the common line 12. In other words, the capacitor 23 is provided nearer on the envelope tracker 6 side than the main inductor 22. One end side of the capacitor 23 is connected to the common line 12, another end side of the capacitor 23 is grounded. With this configuration, the capacitor 23 attenuates the noise signal flowing in the common line 12 by cooperating with the main inductor 22. Here, it is necessary for the capacitor 23 and the main inductor 22 to suppress attenuation of the variable voltage Vvar changing in accordance with the envelope signal Se and to attenuate the noise signal. Accordingly, it is preferable that capacitance characteristics of the capacitor 23 be a value such that cutoff frequency thereof is higher than the frequency of the envelope signal Se, when a low pass filter is configured by combining the capacitor 23a and the main inductor 22.

An example of an operation of the power supply circuit 1 having a configuration as described above will now be described.

When the power supply circuit 1 is driven, the power supply voltage circuit 5 supplies the power supply voltage V toward the envelope tracker 6. The envelope tracker 6 controls the variable voltage Vvar on the basis of the envelope signal Se outputted from the baseband portion 7, supplies the variable voltage Vvar to each of the power amplifiers 2, 3, and 4. In this case, the envelope signal Se corresponds to an amplitude level of the radio frequency signals RF1, RF2, and RF3, the envelope tracker 6 can therefore control the variable voltage Vvar in accordance with the amplitude level of the radio frequency signals RF1, RF2, and RF3.

On the other hand, the baseband portion 7 modulates the input signal such as audio, data or the like to the baseband signal, outputs the baseband signal to the RF portion 8. Additionally, the baseband portion 7 outputs the envelope signal Se toward the envelope tracker 6. The RF portion 8 up-converts the baseband signal and generates the radio frequency signals RF1, RF2, and RF3 for performing the radio transmission, and outputs the generated signals toward the power amplifiers 2, 3, and 4 through the SAW filters 9, 10, and 11. Then, the power amplifiers 2, 3, and 4 amplify power of the radio frequency signals RF1, RF2, and RF3 outputted from the RF portion 8 to a level necessary for transmission to the base station, on the basis of the variable voltage Vvar supplied from the envelope tracker 6, and output the transmission signals Tx1, Tx2, and Tx3, respectively, from the output terminals.

At this time, the envelope tracker 6 and the power amplifiers 2, 3, and 4 are connected by the common line 12 and the branch lines 13, 16, and 19, and the main inductor 22 is provided on the common line 12, the sub-inductors 14, 17, and 20 are provided on the branch lines 13, 16, and 19, respectively. With this configuration, it is possible to attenuate the noise signal conducted in the common line 12 and the branch lines 13, 16, and 19 by the main inductor 22 and the sub-inductors 14, 17, and 20. On the other hand, the cutoff frequency of the main inductor 22 is made higher than the frequency of the envelope signal Se, and the self-resonant frequencies of the main inductor 22 and the sub-inductors 14, 17, and 20 are made higher than frequency of the envelope signal Se. Accordingly, the power supply circuit 1 can attenuate the noise signal conducted in the common line 12 and the branch lines 13, 16, and 19, while maintaining a voltage waveform of the variable voltage Vvar supplied from the envelope tracker 6.

Figure 3:
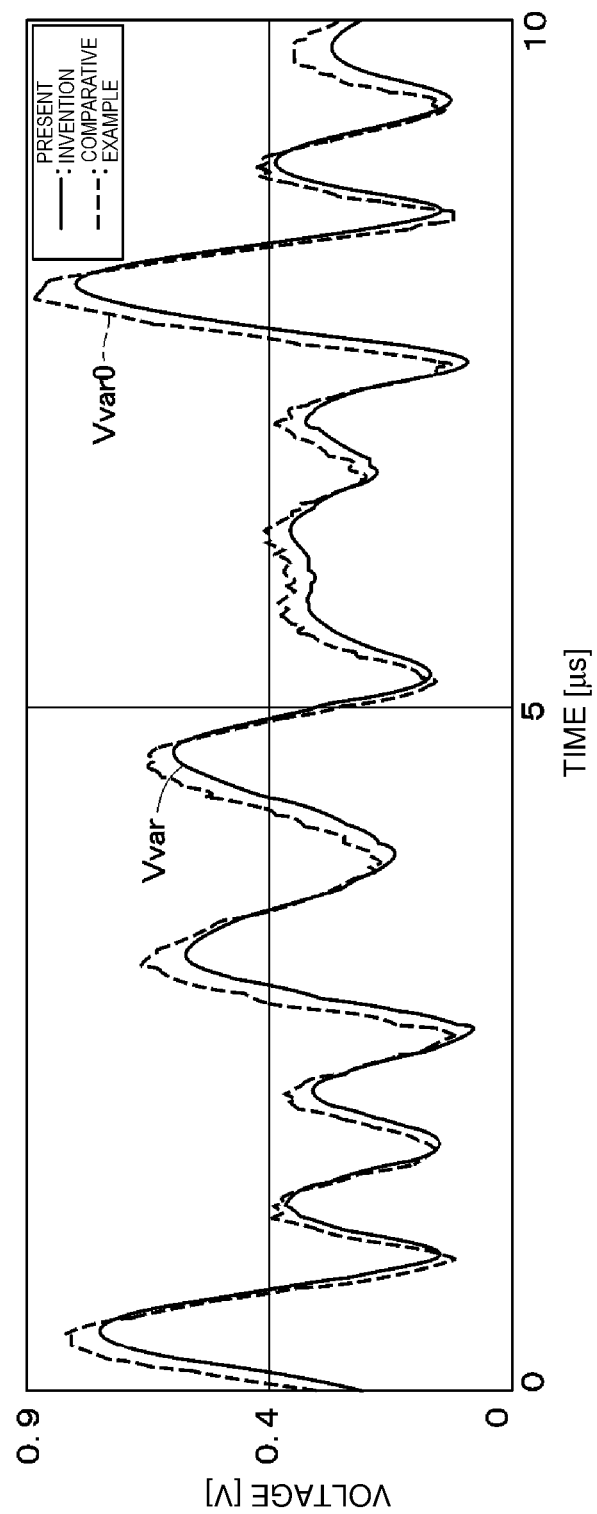
FIG. 3 is a characteristic line diagram illustrating a temporal change in a voltage of the power supply circuit in the embodiment and a comparative example of the present disclosure.

In order to confirm effects of the power supply circuit 1 according to the present embodiment as described above, a temporal change in the variable voltage Vvar of the power supply circuit 1 is obtained. The result is illustrated in FIG. 3 by a solid line. Additionally, for comparison with the result of the power supply circuit 1 according to the present embodiment, as a comparative example, in a power supply circuit in a case where the sub-inductors 14, 17, and 20 and the main inductor 22 are omitted, a temporal change in a variable voltage Vvar0 conducted between the envelope tracker and the power amplifier is illustrated in FIG. 3 by a broken line.

As illustrated in FIG. 3, in the power supply circuit in the comparative example, a noise signal with a high-frequency is included in the variable voltage Vvar0. The reason is considered that the noise signal flowing in the power supply circuit is not attenuated by using the inductor.

As opposed to this, in the power supply circuit 1 according to the present embodiment, as compared to the comparative example, it can be seen that the noise signal included in the variable voltage Vvar is reduced and the noise signal is attenuated. Furthermore, in this case, in the power supply circuit 1, a cutoff frequency of the main inductor 22 is a frequency higher than the frequency of the envelope signal Se, and thus, it can be seen that, while maintaining the voltage waveform of the variable voltage Vvar, the variable voltage Vvar is transmitted.

Figure 4:
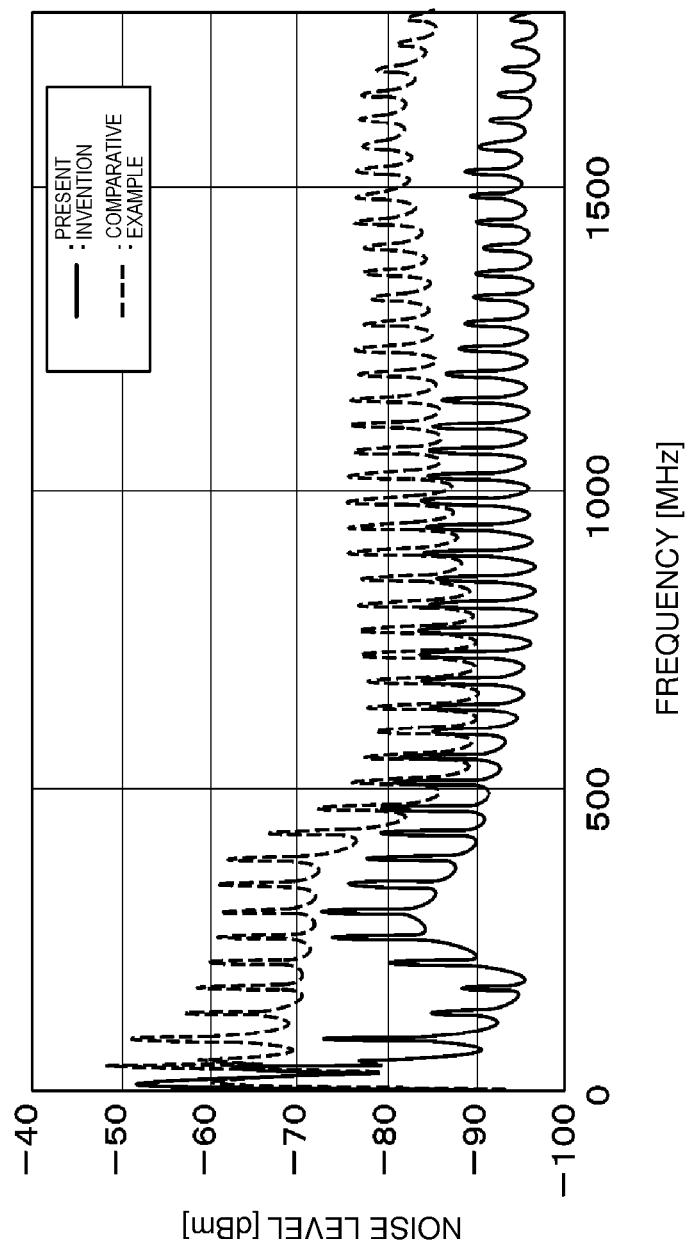
FIG. 4 is a characteristic line diagram illustrating frequency characteristics of a noise level of the power supply circuit in the embodiment and the comparative example of the present disclosure.
Figure 5:
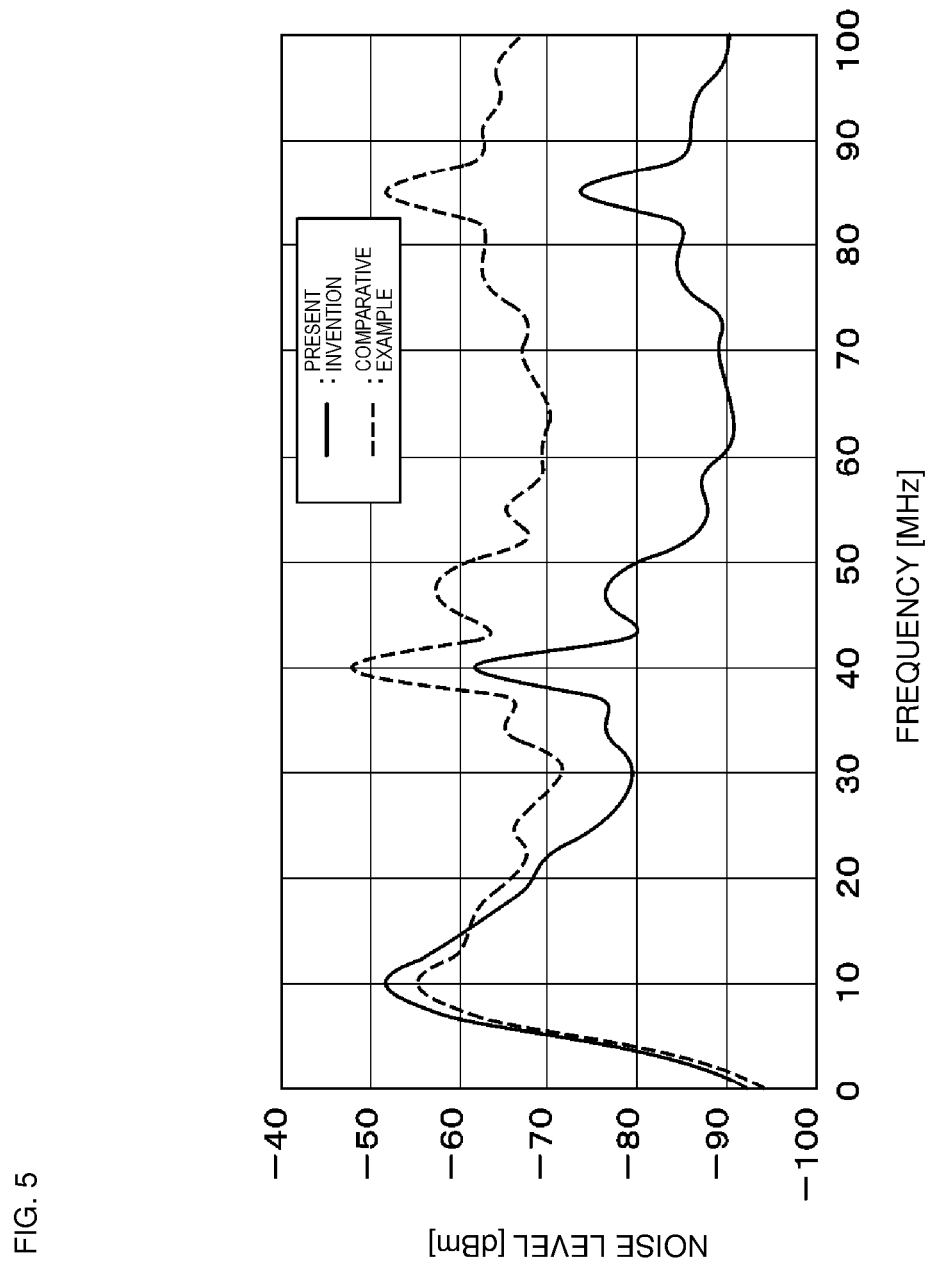
FIG. 5 is a characteristic line diagram illustrating the frequency characteristics of the noise level of the power supply circuit in FIG. 4 in an enlarged manner.

Additionally, in order to confirm effects of the power supply circuit 1 according to the present embodiment, frequency characteristics of a noise level of the power supply circuit 1 are obtained. The result is illustrated in FIG. 4 and FIG. 5 by a solid line. Here, for comparison with the result of the power supply circuit 1 according to the present embodiment, as a comparative example, frequency characteristics of a noise level by a power supply circuit in a case where the sub-inductors 14, 17, and 20 and the main inductor 22 are omitted are illustrated in FIG. 4 and FIG. 5 by a broken line. Note that, when deriving the frequency characteristics of the noise level of the power supply circuit 1, capacitance of the capacitor 23 is set to 270 pF.

As illustrated in FIG. 4, in the power supply circuit in the comparative example, the noise level is not attenuated as compared to the power supply circuit 1 according to the present embodiment. The reason is considered that the noise signal flowing in the power supply circuit is not attenuated by using the inductor.

As opposed to this, in the power supply circuit 1 according to the present embodiment, as compared to the comparative example, it can be seen that the noise signal is attenuated. Particularly, in bands not more than 500 MHz and not less than 700 MHz, an attenuation effect of the noise level is high. Additionally, as illustrated in FIG. 5, in a band not more than 20 MHz, there is no difference between an attenuation effect of the noise level of the power supply circuit 1 according to the present embodiment and an attenuation effect of the noise level according to the comparative example. The reason is considered that a cutoff frequency of the main inductor 22 is set to a frequency higher than 20 MHz which is a frequency of the envelope signal Se. As a result, even if the variable voltage Vvar is subjected to amplitude modulation in the vicinity of 20 MHz in accordance with the envelope signal Se, it is possible to supply the variable voltage Vvar whose voltage waveform is maintained to the power amplifiers 2, 3, and 4.

Note that, the voltage waveform of the variable voltage Vvar outputted from the envelope tracker 6 changes in accordance with variation in the radio frequency signals RF1, RF2, and RF3, and therefore includes an AC component. When a normal ferrite bead is used to take noise countermeasures to the variable voltage Vvar, the voltage waveform delays by the component, and cannot be made to follow variation in signal waveforms of the radio frequency signals RF1, RF2, and RF3 in some cases. Additionally, when current flows in the ferrite bead, characteristics thereof vary due to magnetic saturation of a ferrite material, and thus variations in delay amounts arise. Taking into consideration the above-described points, the main inductor 22 is preferably an electronic component with superior superposition characteristics and less change in characteristics even when being applied to the power supply lines (common line 12 and branch lines 13, 16, and 19) supplying the variable voltage Vvar to the power amplifiers 2, 3, and 4. At the same time, for the main inductor 22, an electronic component compatible with a narrow deviation is preferably used.

As described above, according to the present embodiment, the power supply circuit 1 includes the main inductor 22 provided on the common line 12, and the sub-inductors 14, 17, and 20 provided on the branch lines 13, 16, and 19, respectively. In this case, it is possible to reduce the noise signal conducted in the common line 12 by the main inductor 22, and reduce the noise signal conducted in each of the branch lines 13, 16, and 19 by each of the sub-inductors 14, 17, and 20. With this configuration, the noise signal conducted from the envelope tracker 6 toward each of the power amplifiers 2, 3, and 4 can be reduced by each of the sub-inductors 14, 17, and 20 and the main inductor 22. As a result, resonance and radiation of the noise signal between the envelope tracker and each of the power amplifiers can be suppressed, and thus communication characteristics can be improved while suppressing degradation of reception sensitivity even in any band of the radio frequency signals RF1, RF2, and RF3 of multiband.

Additionally, the cutoff frequency of the main inductor 22 is made higher than the frequency of the envelope signal Se. In this case, the envelope signal Se conducted in the power supply circuit 1 has a frequency lower than that of the noise signal that the main inductor 22 can reduce. Accordingly, the power supply circuit 1 can attenuate the noise signal while suppressing attenuation of the envelope signal Se.

Additionally, the self-resonant frequency of the main inductor 22 is made higher than the lowest self-resonant frequency among the self-resonant frequencies of the respective sub-inductors 14, 17, and 20. Here, the plurality of power amplifiers 2, 3, and 4 amplify the radio frequency signals RF1, RF2, and RF3 with different frequencies from one another. At this time, in order to suppress the noise signal with respect to the radio frequency signals RF1, RF2, and RF3, the self-resonant frequency of each of the sub-inductors 14, 17, and 20 is preferably set within the bands of the radio frequency signals RF1, RF2, and RF3, for example. In contrast, because the self-resonant frequency of the main inductor 22 is made higher than the lowest self-resonant frequency among the self-resonant frequencies of the respective sub-inductors 14, 17, and 20, impedance of the main inductor 22 can be increased across the plurality of bands of the radio frequency signals RF1, RF2, and RF3. As a result, in the plurality of bands of the radio frequency signals RF1, RF2, and RF3, the noise signal can be reduced.

Additionally, the electric length between the envelope tracker 6 and the main inductor 22 is made shorter than the half-wave length of the signal with the highest frequency (the radio frequency signal RF3) among the respective radio frequency signals RF1, RF2, and RF3. With this configuration, even when the multiple reflection of the noise signal arises between the envelope tracker 6 and the main inductor 22 and the noise signal is radiated, the frequency of the noise signal to be radiated can be made higher than any frequency of the radio frequency signals RF1, RF2, and RF3.

In addition, the electric length between the envelope tracker 6 and each of the power amplifiers 2, 3, and 4 is configured so as to be shorter than the half-wave length of the signal with the highest frequency (the radio frequency signal RF3) among the radio frequency signals RF1, RF2, and RF3. With this configuration, even when the multiple reflection of the noise signal arises between the envelope tracker 6 and the power amplifiers 2, 3, and 4 and the noise signal is radiated, the frequency of the noise signal to be radiated can be made higher than any frequency of the radio frequency signals RF1, RF2, and RF3. As a result, the frequency of the noise signal can be made to be outside the plurality of bands of the radio frequency signals RF1, RF2, and RF3, and thus an influence of the noise signal on the radio frequency signals can be reduced.

Note that, the embodiment is configured such that the power supply circuit 1 includes the three power amplifiers 2, 3, and 4. However, the present disclosure is not limited thereto, the configuration may be such that the power supply circuit includes two power amplifiers, or includes four or more power amplifiers.

Additionally, in the embodiment, the power amplifiers 2, 3, and 4 amplify the radio frequency signals RF1, RF2, and RF3 of 700 MHz, 1.5 GHz, and 2 GHz, respectively. These plurality of frequency bands of the radio frequency signals are not limited to the bands described above, are appropriately set in accordance with a communication system or the like. In the same manner, although a case where the frequency of the envelope signal Se is 20 MHz is described as an example, the frequency is not limited thereto, is appropriately set in accordance with a specification of the baseband portion 7 or the like.

Furthermore, the embodiment describes a case of being applied to a multiband mobile terminal for transmitting the plurality of radio frequency signals RF1, RF2, and RF3 with different frequency bands from one another as an example. The present disclosure is not limited thereto, may be applied to a multimode mobile terminal which transmits a plurality of radio frequency signals with modulation systems different from one another such as W-CDMA, LTE, or the like, for example. In this case, it is not necessary for the plurality of radio frequency signals to have different frequency bands, the bands may overlap with one another.

Additionally, the embodiment is configured such that the sub-capacitors 15, 18, and 21 are provided between the branch point 12A of the common line 12 and the sub-inductors 14, 17, and 20, respectively. However, the present disclosure is not limited thereto, may be configured such that each of the sub-capacitors is provided between each of the sub-inductors and each of the power amplifiers. Also, although a case where the sub-inductor and the sub-capacitor are provided separately from the power amplifier is described as an example, a configuration in which the sub-inductor and the sub-capacitor are built in the power amplifier may be used.

Furthermore, the embodiment is configured such that the cutoff frequency of the main inductor 22 is made higher than the frequency of the envelope signal Se. However, the present disclosure is not limited thereto, the cutoff frequency of the main inductor may be a value approximately the same as the frequency of the envelope signal Se, or may be a value lower than the frequency of the envelope signal Se.

Additionally, the embodiment is configured such that the self-resonant frequency of the main inductor 22 is made higher than the lowest self-resonant frequency among the self-resonant frequencies of the respective sub-inductors 14, 17, and 20. However, the present disclosure is not limited thereto, the self-resonant frequency of the main inductor may be lower than the self-resonant frequency of each of the sub-inductors.

In addition, the embodiment is configured such that the electric length between the envelope tracker 6 and the main inductor 22 is shorter than the half-wave length of the highest frequency among the radio frequency signals RF1, RF2, and RF3. However, the present disclosure is not limited thereto, the electric length between the envelope tracker and the main inductor may be longer than the half-wave length of the signal with the highest frequency among the radio frequency signals RF1, RF2, and RF3.

Furthermore, the embodiment is configured such that the electric length between each of the power amplifiers 2, 3, and 4 and the envelope tracker 6 is shorter than the half-wave length of the signal with the highest frequency among the three types of radio frequency signals RF1, RF2, and RF3. The present disclosure is not limited thereto, the electric length between each of the power amplifiers and the envelope tracker may be longer than the half-wave length of the signal with the highest frequency among the radio frequency signals RF1, RF2, and RF3.

What is claimed is:

1. A power supply circuit comprising:
    a plurality of power amplifiers, each configured to amplify a respective one of a plurality of radio frequency signals;
    an envelope tracker configured to supply a variable voltage based on an envelope signal to the plurality of power amplifiers;
    a common line connected to an output side of the envelope tracker;
    a plurality of branch lines branching from a tip of the common line and respectively connected to the plurality of power amplifiers;
    a plurality of sub-inductors respectively provided on the plurality of branch lines;
    a main inductor provided on the common line;
    a capacitor provided on the common line;
    a radio frequency circuit configured to output the radio frequency signals; and
    a plurality of filters configured to filter the radio frequency signals output by the radio frequency circuit before the radio frequency signals are received by the power amplifiers.

2. The power supply circuit according to claim 1, wherein:
    a cutoff frequency of the main inductor is higher than a frequency of the envelope signal.

3. The power supply circuit according to claim 1, wherein:
    a self-resonant frequency of the main inductor is higher than a lowest self-resonant frequency among self-resonant frequencies of the respective sub-inductors.

4. The power supply circuit according to claim 1, wherein:
    an electric length between the envelope tracker and the main inductor is shorter than a half-wave length of a signal with a highest frequency among the radio frequency signals.

5. The power supply circuit according to claim 1, wherein:
    an electric length between the envelope tracker and the power amplifier is shorter than the half-wave length of the signal with the highest frequency among the radio frequency signals.

6. The power supply circuit according to claim 1, further comprising:
    a base band circuit configured to provide a signal to the radio frequency circuit, which outputs the radio frequency signals based on the provided signal.

7. The power supply circuit according to claim 6, wherein:
    the base band circuit is further configured to output the envelope signal to the envelope tracker.

8. The power supply circuit according to claim 1, wherein:
    the radio frequency signals are each within a respective frequency band different from one another.

9. The power supply circuit according to claim 1, wherein:
    the radio frequency signals are within overlapping frequency bands.

10. The power supply circuit according to claim 1, further comprising:
    a base band circuit configured to output the envelope signal to the envelope tracker.

11. The power supply circuit according to claim 1, further comprising:
    a plurality of sub-capacitors respectively provided on the plurality of branch lines.

12. The power supply circuit according to claim 1, wherein:
    each of the power amplifiers is configured to output a respective transmission signal based on the respective one of a plurality of radio frequency signals.

* * * * *